(12) United States Patent
Kloster et al.

(10) Patent No.: US 7,034,399 B2
(45) Date of Patent: Apr. 25, 2006

(54) FORMING A POROUS DIELECTRIC LAYER

(75) Inventors: Grant M. Kloster, Lake Oswego, OR (US); Kevin P. O'Brien, Portland, OR (US); Justin K. Brask, Portland, OR (US); Michael D. Goodner, Hillsboro, OR (US); Donald Bruner, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/782,329

(22) Filed: Feb. 19, 2004

(65) Prior Publication Data

US 2004/0195693 A1 Oct. 7, 2004

Related U.S. Application Data

(63) Continuation of application No. 10/395,447, filed on Mar. 24, 2003, now Pat. No. 6,737,365.

(51) Int. Cl.
*H01L 23/48* (2006.01)
*H01L 23/52* (2006.01)
*H01L 29/40* (2006.01)

(52) U.S. Cl. .................. 257/758; 257/508; 257/759; 257/760; 257/774

(58) Field of Classification Search ............. 257/508, 257/774, 758–760
See application file for complete search history.

(56) References Cited

U.S. PATENT DOCUMENTS

| 5,218,472 | A | * | 6/1993 | Jozefowicz et al. | 359/584 |
|---|---|---|---|---|---|
| 5,847,443 | A | * | 12/1998 | Cho et al. | 257/632 |
| 6,331,493 | B1 | * | 12/2001 | Sharan | 438/765 |
| 6,387,818 | B1 | * | 5/2002 | Lopatin | 438/723 |
| 6,436,810 | B1 | * | 8/2002 | Kumar et al. | 438/633 |
| 6,596,467 | B1 | * | 7/2003 | Gallagher et al. | 430/314 |
| 6,815,332 | B1 | * | 11/2004 | San et al. | 438/623 |
| 2003/0001240 | A1 | * | 1/2003 | Whitehair et al. | 257/638 |
| 2003/0054115 | A1 | * | 3/2003 | Alabano et al. | 427/487 |
| 2003/0111263 | A1 | * | 6/2003 | Fornof et al. | 174/262 |
| 2003/0114013 | A1 | * | 6/2003 | Hedrick et al. | 438/734 |
| 2003/0218253 | A1 | * | 11/2003 | Avanzino et al. | 257/758 |
| 2004/0061231 | A1 | * | 4/2004 | He et al. | 257/758 |
| 2004/0087166 | A1 | * | 5/2004 | Morrow | 438/694 |
| 2004/0121586 | A1 | * | 6/2004 | Abell | 438/637 |
| 2004/0137831 | A1 | * | 7/2004 | Kollodge et al. | 451/41 |
| 2005/0038276 | A1 | * | 2/2005 | Laxman et al. | 556/436 |

* cited by examiner

*Primary Examiner*—Ida M. Soward
(74) *Attorney, Agent, or Firm*—Trop, Pruner & Hu, P.C.

(57) ABSTRACT

A dielectric layer is made porous by treating the dielectric material after metal interconnects are formed in or through that layer. The porosity lowers the dielectric constant of the dielectric material. The dielectric material may be subjected to an electron beam or a sonication bath to create the pores. The structure has smooth sidewalls for metal interconnects extending through the dielectric layer.

4 Claims, 5 Drawing Sheets

FORMING A POROUS DIELECTRIC LAYER

This is a continuation of prior application Ser. No. 10/395,447, filed Mar. 24, 2003 now U.S. Pat. No. 6,737,365.

FIELD OF THE INVENTION

This invention relates generally to semiconductor devices having one or more dielectric insulating layers with a low dielectric constant, and methods for forming porous dielectric layers.

BACKGROUND

Semiconductor devices include metal layers that are insulated from each other by dielectric layers. As device features shrink, reducing the distance between the metal lines on each layer, capacitance increases. The parasitic capacitance may contribute to effects such as RC delay, power dissipation, and capacitively coupled signals, also known as crosstalk. To address this problem, insulating materials that have relatively low dielectric constants (referred to as low-k dielectrics) are being used in place of silicon dioxide (and other materials that have relatively high dielectric constants) to form the dielectric layer that separates the metal lines.

One way to lower the dielectric constant is to form pores in the dielectric material. For example, some dielectric materials use thermally activated porogens. When heat is applied, the porogen may decompose and/or volatilize, leaving pores in the dielectric material. For example, temperatures in the range of about 250 degrees C. to about 450 degrees C., which may be reached in dual damascene processing, may be used to thermally activate a porogen.

Lower dielectric constants are possible because the pores are voids having dielectric constants near one (1). However, porous dielectric materials have several problems that make those materials difficult to integrate into normal semiconductor processing such as dual damascene processes.

Problems with dielectric materials having thermally activated porogens include surface roughness after etching, non-continuous metal barrier coverage, rough metal barrier interfaces, and susceptibility to chemical decomposition or k-value degradation during dry etch and wet clean processes. Surface roughness and poor barrier coverage may result in significant resistivity variation, uncontrolled copper diffusion, and reduced device reliability.

Surface roughness due to porosity of the dielectric material is a problem because metal interconnects need smooth side walls to maintain low resistance. Surface roughness can significantly increase the resistance of interconnects for integrated circuit devices dimensioned lower than 100 nanometers. For theses reasons, integrating a porous dielectric layer in integrated circuit manufacturing is a problem, especially in dual damascene processes.

What is needed is a dielectric material that may be made porous without the problems of surface roughness and poor barrier coverage. A method of providing a porous dielectric material having a low dielectric constant is needed for increasingly smaller semiconductor device geometries.

DETAILED DESCRIPTION

Figure 1:
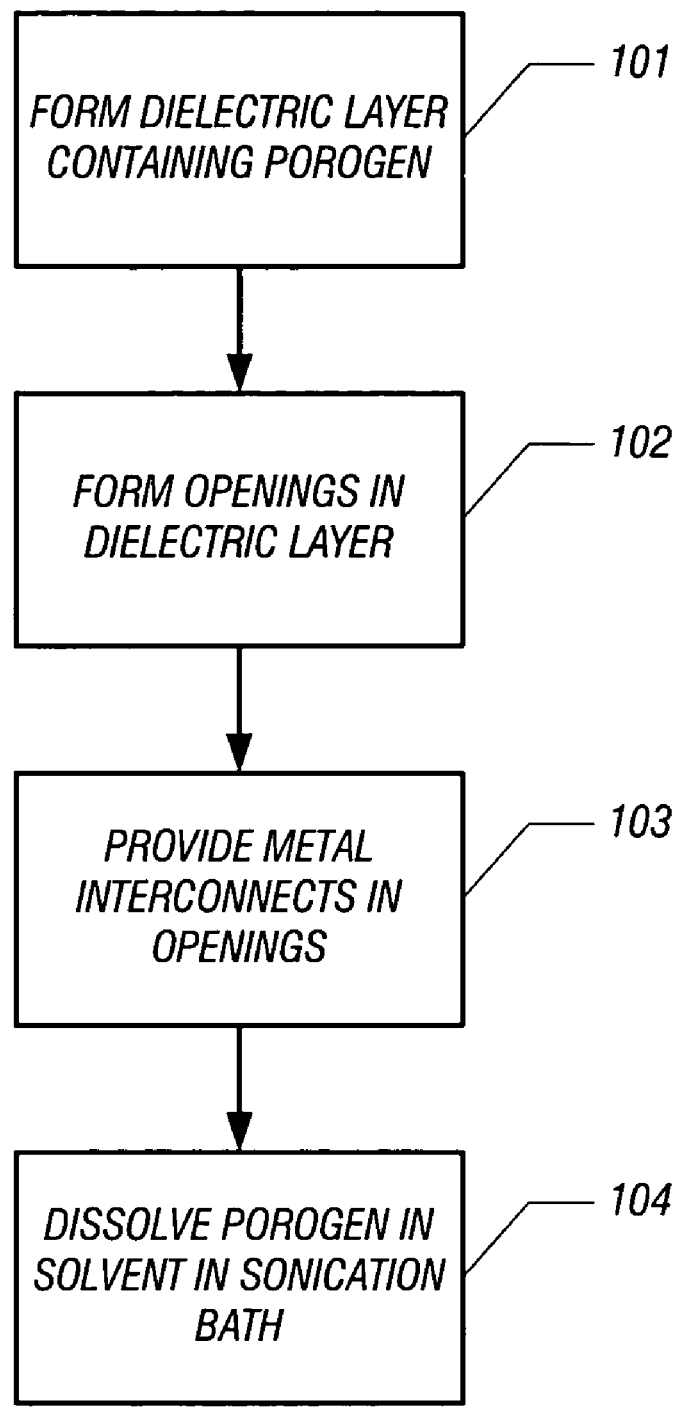
FIG. 1 is a block diagram of a method of forming a porous dielectric layer according to one embodiment.

In one embodiment, shown in the block diagram of FIG. 1, a dielectric layer is formed on a substrate, and pores are formed in the dielectric by treatment with a solvent enhanced by sonication. The dielectric material is not porous when formed on a substrate. The pores may be formed in the dielectric material after metal interconnects are formed in or through openings in the dielectric layer.

In block 101, an interlayer dielectric (ILD) may be formed. The dielectric layer may be a spin-on glass (SOG) dielectric material such as methylsilsesquioxane (MSSQ), hydrosilsesquioxane (HSSQ), or other $SiO_2$-based matrix. Alternatively, the dielectric layer may be a polymer-based material, or may be deposited by chemical vapor deposition (CVD) or plasma enhanced chemical vapor deposition (PECVD).

The dielectric layer may be formed over a metal conductive layer. Optionally, a barrier layer also may be formed between the dielectric layer and metal layer. Optionally, a capping layer containing a porogen also may be formed over the dielectric layer.

In one embodiment, a porogen is included or embedded in the interlayer dielectric material. For example, the porogen may be a polymer mixed with the dielectric material. Various polymers may be used as porogens in accordance with various embodiments of the present invention. As will be discussed in more detail below, the porogens preferably are not activated or dissolved until after metal interconnects are formed in or through the interlayer dielectric material.

In block 102, one or more openings are made in the dielectric layer by patterning using photolithography techniques. The openings may extend partially or completely through the dielectric layer. The opening or openings in the dielectric layer may be formed using a dual damascene, single damascene, or direct patterning process, for example.

In block 103, metal interconnects are formed in the openings. The metal interconnects may be copper or other metal lines or traces that extend partially or completely through the dielectric layer and may contact the underlying metal layer. Optionally, formation of the metal interconnects may include processing steps to polish and/or planarize the surface of the device.

In block 104, according to one embodiment, the porogen in the dielectric layer is dissolved and/or desorbed in a solvent, enhanced by sonication. Sonication is irradiation by sound waves to increase the rate of the dissolution or desorption reaction. In one embodiment, the porogen may be dissolved out of the dielectric layer by immersing the dielectric layer (or the entire substrate) in a liquid solvent in a sonication bath. The sonication energy effectively lowers the surface tension of the liquid solvent in the bath to enhance solvent penetration into the dielectric layer that includes a porogen.

Dissolution or desorption of the porogen creates voids in the interlayer dielectric to lower the dielectric constant of the dielectric material. As a result of dissolving or desorbing the porogen in a sonication bath, a porous dielectric material is formed after metal interconnects are in place, so that the metal interconnects have smooth sidewalls. For example, dielectric material after sonication enhanced dissolution of porogens may have at least 50% porosity.

In one embodiment, porogens in the dielectric material may be selected to have desorption temperatures at or above the maximum temperatures of dual damascene processes, i.e., above about 400 degrees C., and more preferably above about 450 degrees C. Optionally, porogens that evaporate, dissolve, or desorb at higher temperatures (i.e., 600 degrees C. or higher) also may be used. Thus, pores may not be formed by thermal activation of porogens during processing steps at or below such temperatures.

An appropriate solvent may be selected for a specified polymer porogen. For example, the polymers and appropriate solvents for use in various embodiments of the invention may be grouped generally as non-polar systems, slightly polar systems, or highly polar systems. The choice of system may depend on other processing constraints such as thermal budgets, or solvent compatibility with capping layers such as hard masks or etch stops.

Examples of polymers that may be used in non-polar systems in several embodiments of the invention include but are not limited to the following: poly(ethylene), poly(propylene), poly(styrene), poly(isobutylene), poly(propyl acrylate), and poly(butadiene). Examples of solvents that may be used in non-polar systems in embodiments of the invention include but are not limited to the following: benzene, toluene, mesitylene, ethyl acetate, and dioxane.

Examples of polymers that may be used in slightly polar systems in several embodiments of the invention include but are not limited to the following: poly(vinyl acetate), poly (methyl methacrylate), and poly(ethylene terepthalate). Examples of solvents that may be used in slightly polar systems in embodiments of the invention include but are not limited to the following: acetone, cyclohexanone, tetrahydrofuran, methyl ethyl ketone, isopropanol, ethyl lactate, and propylene glycol monoethyl ether acetate (PGMEA).

Examples of polymers that may be used in highly polar systems in several embodiments of the invention include but are not limited to the following: poly(vinyl alcohol), poly (acrylonitrile), poly(cyanomethyl acrylate), poly(aminocaprylic acid), and poly(hexamethylene adipamide). Examples of solvents that may be used in highly polar systems in embodiments of the invention include but are not limited to the following: ethanol, propylene carbonate, butyrolactone, ethylene glycol, dimethyl formamide, acetonitrile, and N-methylpyrrolidone (NMP).

Figure 2:
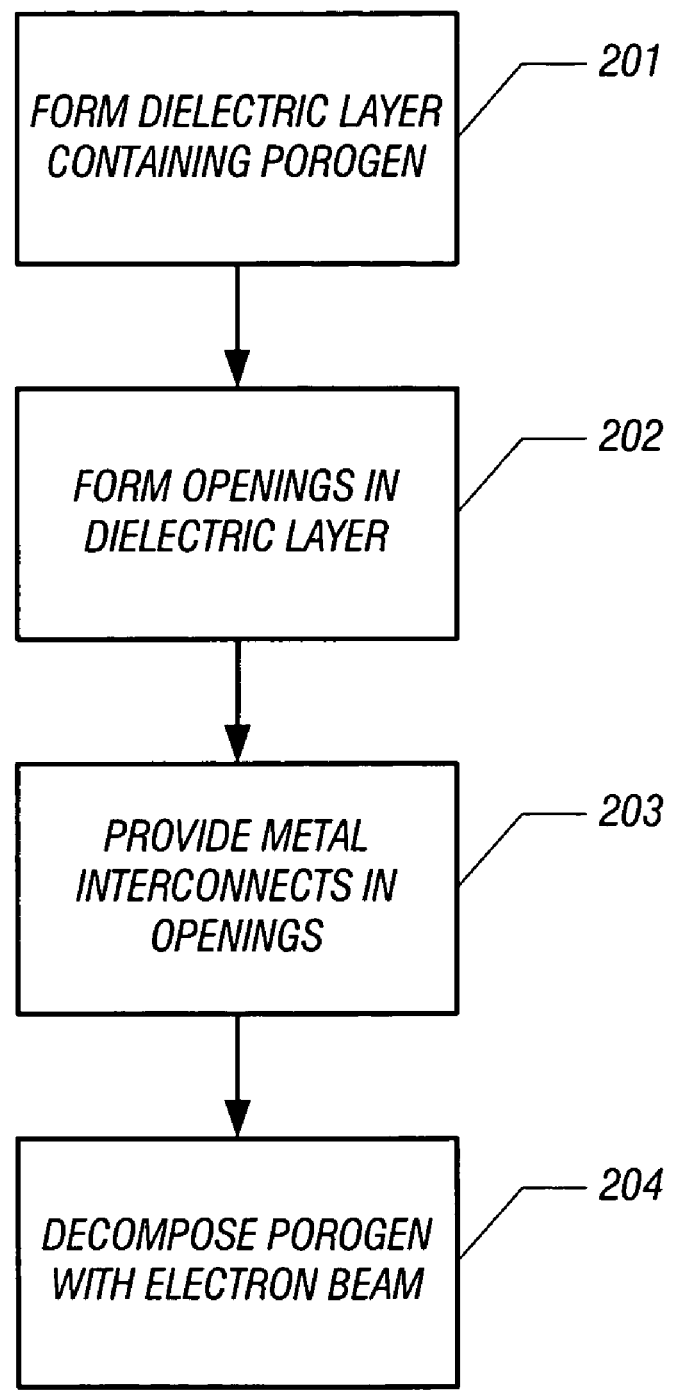
FIG. 2 is a block diagram of a method of forming a porous dielectric layer according to a second embodiment.

In a second embodiment of the invention, shown in FIG. 2, a dielectric layer is formed on a substrate, and pores are formed in the dielectric by directing an electron beam at the material after metal interconnects are formed in or through openings in the dielectric layer.

In block 201, a dielectric layer is formed on a substrate. The dielectric material may be a silicon dioxide such as a silsesquioxane-based material, or a carbon-doped oxide (CDO) having long chain carbon moieties attached to a CDO matrix or framework.

In one embodiment, the dielectric material includes a porogen susceptible to electron beam fragmentation or degradation, having a thermal stability greater than about 400 degrees C., and more preferably above about 450 degrees C.

In one embodiment, the dielectric may be an oxide based matrix, with an organic polymer porogen that is susceptible to electron beam fragmentation. In another embodiment, the porogen may be an electron beam photoresist material based on styrene, butene, or acrylate chemistry in a cross-linked aromatic polymer. For example, poly(methyl methacrylate) (PMMA) may be included in a cross-linked aromatic polymer to produce a thermally stable material that is susceptible to electron beam fragmentation. These are examples of thermally stable materials that may be used as porogens that are susceptible to electron beam degradation or fragmentation.

In block 202, one or more openings are formed in the dielectric material by dual damascene, single damascene, or similar processes. The openings may be patterned using photolithography processes.

In block 203, metal interconnects may be formed in the openings in or through the dielectric layer. Forming metal interconnects also may include related chemical mechanical polishing (CMP) or planarizing steps.

In block 204, an electron beam is directed at the dielectric layer to create pores in the material. In one embodiment, a flood electron beam may be directed at the dielectric layer, exposing most or all of the substrate at once. Optionally, the electron beam may be targeted to treat the dielectric layer at a specified depth. In another embodiment, a thin electron beam may be scanned across the substrate or dielectric surface.

As a result of directing the electron beam at the dielectric material, porogens in the dielectric layer may fragment, degrade, and/or decompose. The dielectric layer may contain porogens that fragment, degrade and/or decompose at relatively low energies to form volatile species, which may be removed from the material.

For example, in one embodiment, CDO dielectric material may undergo carbon depletion during treatment with an electron beam. When so treated with an electron beam, larger carbon chains may produce larger pores and a higher degree of porosity, resulting in a lower dielectric constant (k).

In one embodiment, the dielectric layer also may be heated after the electron beam is directed at the substrate. For example, the porogen or pore-generating material may fragment into components that are volatile at lower temperatures, i.e., below about 250 degrees C. The volatile fragments may be removed by heating.

The electron beam directed at the dielectric layer can achieve significant porosity, for example, at least 50% porosity, resulting in a dielectric layer having a low dielectric constant, for example, below about 3.0. If the electron beam is applied after metal interconnects are formed in the dielectric layer, the side walls of the metal interconnects may be smooth instead of rough. Additionally, the dielectric layer may have high structural integrity sufficient to support additional layers above it.

FIGS. 3A–3D illustrate cross-sections of a device that may be made using a method according to a second embodiment of the invention. That device includes a substrate 301 upon which is formed a conductive layer 302. Conductive layer 302 is covered by barrier layer 303, which in turn is covered by dielectric layer 304 containing porogens.

Substrate 301 may be any surface, generated when making an integrated circuit, upon which a conductive layer may be formed. Substrate 301 thus may include, for example, active and passive devices that are formed on a silicon wafer such as transistors, capacitors, resistors, diffused junctions, gate electrodes, local interconnects, etc. Substrate 301 also may include insulating materials (e.g., silicon dioxide, either undoped or doped with phosphorus (PSG) or boron and phosphorus (BPSG); silicon nitride; silicon oxynitride; or a polymer) that separate such active and passive devices from the conductive layer or layers that are formed on top of them, and may include previously formed conductive layers.

Conductive layer 302 may be made from materials conventionally used to form conductive layers for integrated circuits. For example, conductive layer 302 may be made from copper, a copper alloy, aluminum or an aluminum alloy, such as an aluminum/copper alloy. Alternatively, conductive layer 302 may be made from doped polysilicon or a silicide, e.g., a silicide comprising tungsten, titanium, nickel or cobalt.

Conductive layer 302 may include a number of separate layers. For example, conductive layer 302 may comprise a primary conductor made from an aluminum/copper alloy that is sandwiched between a relatively thin titanium layer located below it and a titanium, titanium nitride double layer located above it. Alternatively, conductive layer 302 may comprise a copper layer formed on underlying barrier and seed layers.

Although a few examples of the types of materials that may form conductive layer 302 have been identified here, conductive layer 302 may be formed from various other materials that can serve to conduct electricity within an integrated circuit. Although copper is preferred, the use of any other conducting material, which may be used to make an integrated circuit, falls within the spirit and scope of the present invention.

Figure 3A:
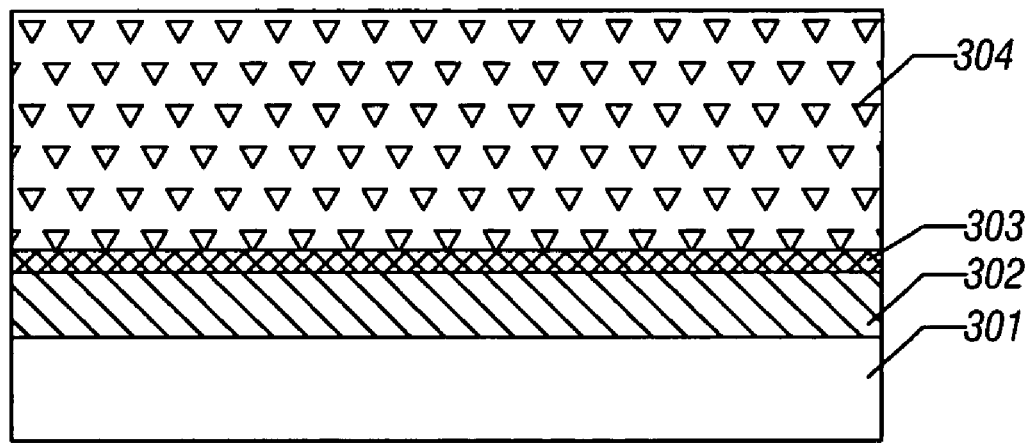
FIGS. 3A–3D provide a schematic representation of a porous dielectric layer formed on a semiconductor substrate in the second embodiment.

As shown in FIG. 3A, barrier layer 303 covers conductive layer 302. Barrier layer 303 may inhibit diffusion into dielectric layer 304 of copper or other elements that may be included in conductive layer 302. In addition, barrier layer 303 may perform an etch stop function—a function which may be particularly desirable if an opening etched through the overlying dielectric layer is unlanded. Barrier layer 303 preferably comprises silicon nitride or silicon carbide, but may be made of other materials that can inhibit diffusion from conductive layer 302 into dielectric layer 304 and provide high selectivity to etch chemistry used to etch a layer, or layers, formed on top of barrier layer 303. Other materials that may provide such properties include titanium nitride and oxynitride.

Barrier layer 303 should be thick enough to perform such functions, but not so thick that it adversely impacts the overall dielectric characteristics resulting from the combination of barrier layer 303 and dielectric layer 304. To balance these two factors, the thickness of barrier layer 303 preferably should be less than about 10% of the thickness of dielectric layer 304.

Dielectric layer 304 may be a spin-on glass (SOG) dielectric material such as methylsilsesquioxane (MSSQ), hydrosilsesquioxane (HSSQ), or other $SiO_2$-based matrix. Alternatively, the dielectric layer may be a polymer-based material. Or the dielectric layer also may be deposited by chemical vapor deposition (CVD) or plasma enhanced chemical vapor deposition (PECVD). In one embodiment, the dielectric may be a carbon-doped oxide (CDO) having long chain carbon moieties attached to a CDO matrix or framework.

As shown in FIG. 3A, a porogen is embedded in the interlayer dielectric. The porogen may have thermal stability greater than about 400 degrees C., and more preferably greater than about 450 degrees C. In one embodiment, the porogen may be a polymer that is mixed with the dielectric material. Various polymers may be used as porogens in accordance with the present invention. In one embodiment, the polymer porogen may be susceptible to electron beam fragmentation. In another embodiment, the porogen may be an electron beam photoresist material based on styrene, butene, or acrylate chemistry in a cross-linked aromatic polymer.

Figure 3B:
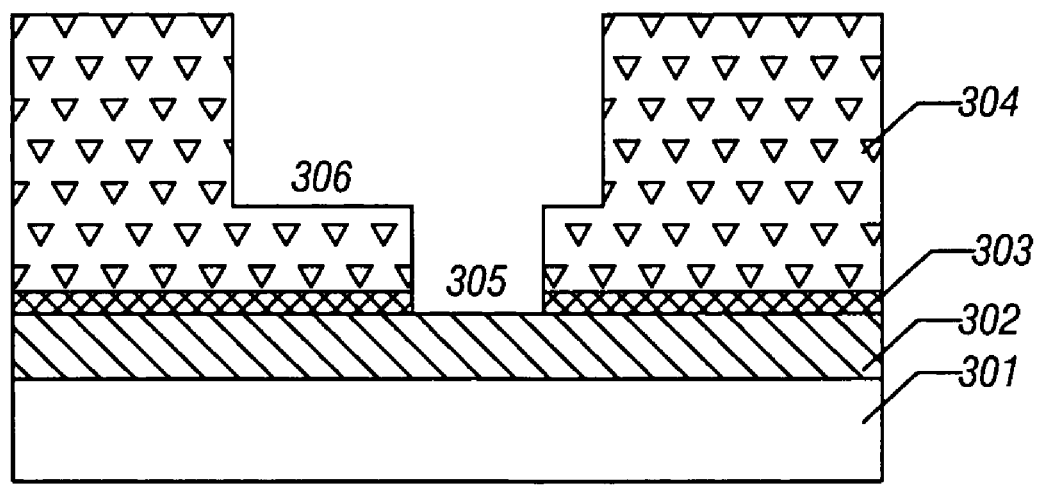

As shown in FIG. 3B, one or more openings 305, 306 are formed in the dielectric material using dual damascene, single damascene, or similar processes. The openings may be trenches and/or vias patterned using photolithography processes, with dielectric material removed by etching.

Figure 3C:
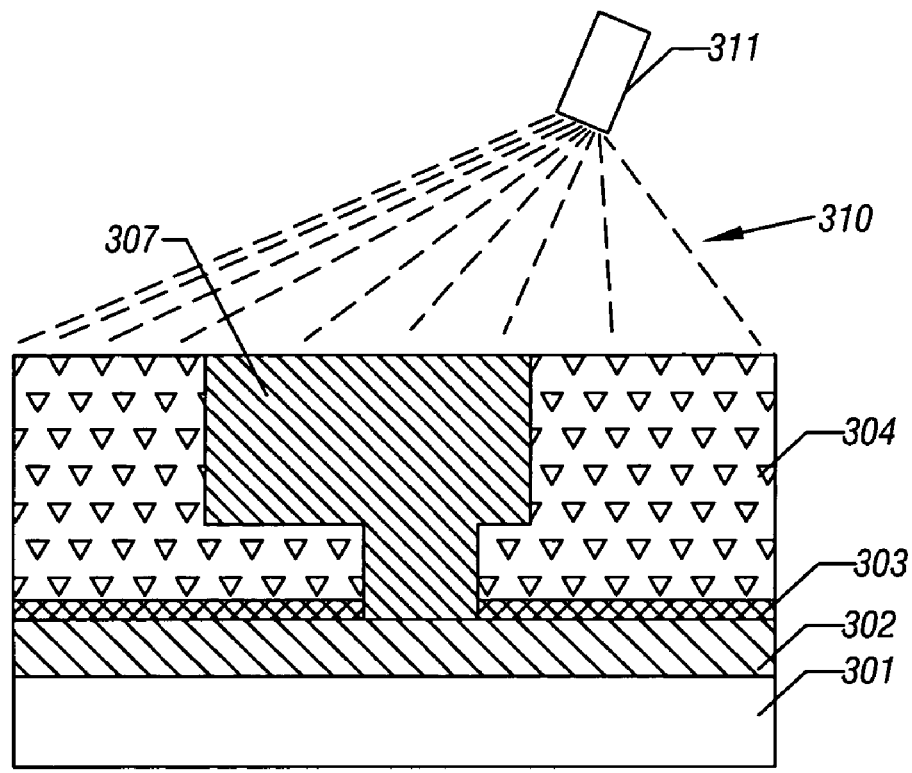

In FIG. 3C, metal interconnect 307 is formed in an opening in the dielectric layer. Forming the metal interconnect also may include related chemical mechanical polishing (CMP) or planarizing steps. After the metal interconnect is formed, as shown in FIG. 3C, electron beam source 311 directs electron beam 310 at the dielectric layer to form pores in the material. The electron beam source may provide a flood electron beam or a thin electron beam.

Figure 3D:
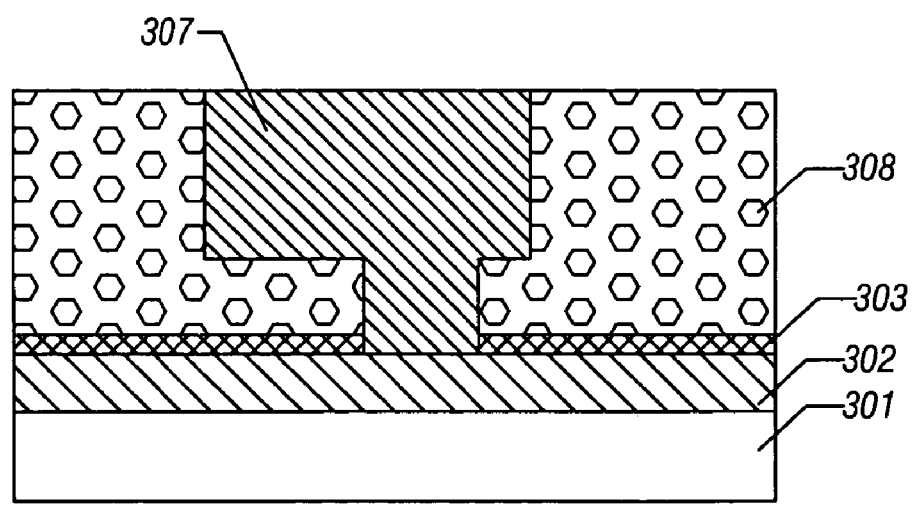

As shown in FIG. 3D, the resulting structure includes dielectric material having pores 308. The material may be at least 50% porous, resulting in a low dielectric constant. The metal interconnects have smooth sidewalls, and the dielectric layer has high structural integrity sufficient to support additional layers above it.

In one embodiment, the dielectric layer also may be heated before or after the electron beam is directed at the substrate. For example, the porogen or pore-generating material may fragment into components that are volatile at lower temperatures, i.e., below about 250 degrees C. The volatile fragments may be removed by heating.

Figure 4:
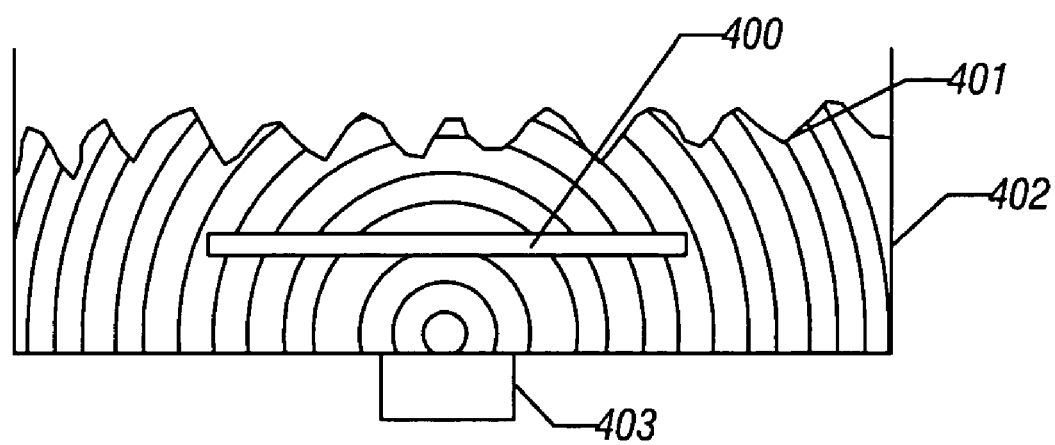
FIG. 4 is a schematic representation of a method of forming a porous dielectric layer in the first embodiment.

FIG. 4 is a schematic representation of the first embodiment in which pores are formed in dielectric layer on a substrate by dissolving and/or desorbing a porogen in a solvent enhanced by sonication. Before treating the dielectric layer with a solvent enhanced by sonication, a dielectric layer is formed on the substrate, an opening is formed in the dielectric layer, and metal interconnects may be formed in the opening.

After the metal interconnects are formed in the dielectric layer, according to this embodiment, substrate 400 is immersed in liquid solvent 401 in sonication bath 402. An appropriate solvent may be selected for a specified polymer porogen. An example of a source of sonication energy is transducer 403 connected to the sonication bath. The sonication energy may be in a frequency range from about 10 Kilohertz to about 2000 Kilohertz, with power in the range of about 1 watt/cm$^2$ to about 10 watts/cm$^2$. The sonication energy effectively lowers the surface tension of the liquid solvent in the bath to enhance the solvent penetration into the dielectric layer.

Dissolution of the porogen creates a dielectric layer having voids or pores. Sonication enhanced dissolution of the porogen may occur after formation of metal interconnects by dual damascene, single damascene or similar processes. As a result, the sidewalls of the metal interconnects are smooth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A device comprising:
    a semiconductor substrate having at least one layer with conductive metal lines thereon; and
    a porous carbon doped oxide between the metal lines, said porous carbon doped oxide having a facing dielectric surface abutting a conductive metal line, the conductive metal line having a smoother sidewall than the facing dielectric surface.

2. The device of claim 1 wherein the carbon doped oxide is at least 50% porous.

3. The device of claim 2 wherein said carbon doped oxide has a dielectric constant below about 3.0.

4. The device of claim 1 wherein said oxide is over a conductive layer.

* * * * *